(12) United States Patent
Nozawa

(10) Patent No.: US 8,518,609 B2
(45) Date of Patent: *Aug. 27, 2013

(54) PHOTOMASK BLANK, PHOTOMASK, AND PHOTOMASK MANUFACTURING METHOD

(75) Inventor: Osamu Nozawa, Tokyo (JP)

(73) Assignee: Hoya Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/467,071

(22) Filed: May 9, 2012

(65) Prior Publication Data

US 2012/0219889 A1 Aug. 30, 2012

Related U.S. Application Data

(63) Continuation of application No. 12/394,657, filed on Feb. 27, 2009.

(30) Foreign Application Priority Data

Feb. 27, 2008 (JP) .................................. 2008-046889
Jan. 27, 2009 (JP) .................................. 2009-015733

(51) Int. Cl.
*G03F 1/46* (2012.01)
*G03F 1/50* (2012.01)
*G03F 1/58* (2012.01)
*G03F 1/80* (2012.01)

(52) U.S. Cl.
USPC .................................................. 430/4; 430/5

(58) Field of Classification Search
USPC ............................................. 430/4–5
See application file for complete search history.

(56) References Cited

U.S. PATENT DOCUMENTS

| 8,137,867 B2 * | 3/2012 | Nozawa ............................ 430/4 |
| 8,137,868 B2 * | 3/2012 | Nozawa ............................ 430/4 |
| 2005/0208389 A1 | 9/2005 | Ishibashi et al. |
| 2007/0259276 A1 | 11/2007 | Yoshikawa et al. |

FOREIGN PATENT DOCUMENTS

| JP | 57-161857 A | 10/1982 |
| JP | 57161857 A | 10/1982 |
| JP | 6251461 B2 | 10/1987 |
| JP | 62229152 A | 10/1987 |
| JP | 650387 B2 | 6/1994 |
| JP | 2001237174 A | 8/2001 |
| JP | 2001312043 A | 11/2001 |
| JP | 2005347777 A | 12/2005 |
| JP | 2006-078825 A | 3/2006 |
| JP | 2007273514 A | 10/2007 |
| KR | 1020040106342 A | 12/2004 |
| KR | 1020070064612 A | 6/2007 |
| KR | 1020070114025 A | 11/2007 |

OTHER PUBLICATIONS

Japanese Office Action corresponding to Japanese Patent Application No. 2009-015733, dated Jan. 19, 2010.

* cited by examiner

*Primary Examiner* — Mark F Huff
*Assistant Examiner* — John S Ruggles
(74) *Attorney, Agent, or Firm* — Sughrue Mion, PLLC

(57) ABSTRACT

A photomask blank has a light-shielding film composed of at least two layers on a transparent substrate. The light-shielding film includes a light-shielding layer made of a material mainly containing tantalum nitride and containing less than 62 at % nitrogen. The material is capable of being dry-etched with a chlorine-based gas containing no oxygen. The light-shielding film further includes a front-surface antireflection layer formed on the light-shielding layer and made of a material not capable of being dry-etched with a chlorine-based gas, but capable of being dry-etched with a fluorine-based gas.

18 Claims, 6 Drawing Sheets

N=0
Rms=0.59(nm)

N=7(at%)
Rms=0.50(nm)

N=32(at%)
Rms=0.25(nm)

N=62(at%)
Rms=1.46(nm)

US 8,518,609 B2

PHOTOMASK BLANK, PHOTOMASK, AND PHOTOMASK MANUFACTURING METHOD

This is a Continuation of application Ser. No. 12/394,657, filed Feb. 27, 2009, claiming the benefit of priority from Japanese Patent Application No. 2008-046889, filed on Feb. 27, 2008, and Japanese Patent Application No. 2009-015733, filed on Jan. 27, 2009, the disclosures of which are incorporated herein in their entirety by reference.

TECHNICAL FIELD

This invention relates to a photomask for use as a mask in, for example, transferring a fine pattern in the manufacture of semiconductor devices and to a photomask blank as an intermediate product that can be formed into a photomask by applying certain treatments thereto, and further relates to a method of manufacturing a photomask.

BACKGROUND ART

Generally, in the manufacture of semiconductor devices or the like, a fine pattern is formed by photolithography and, in a fine pattern transfer process where the photolithography is performed, a photomask is used as a mask. The photomask is generally obtained by forming a desired fine pattern in a light-shielding film or the like of a photomask blank as an intermediate product. Therefore, the properties of the light-shielding film or the like of the photomask blank as the intermediate product almost exactly determine the performance of the obtained photomask. Conventionally, Cr (chromium) has generally been used as the light-shielding film of the photomask blank.

In the meantime, in recent years, pattern miniaturization has advanced more and more and, following this, a problem such as resist collapse has arisen with the thickness of a conventional resist film. This will be explained hereinbelow. In the case of a light-shielding film mainly containing Cr, either wet etching or dry etching can be used as etching after forming a transfer pattern in a resist film by EB (electron beam) writing or the like. However, in the case of the wet etching, the etching tends to proceed isotropically and thus it has become difficult to cope with the recent pattern miniaturization, while, the dry etching that tends to be anisotropic has become dominant.

In dry-etching a light-shielding film mainly containing Cr, a mixed gas of a chlorine-based gas and an oxygen gas is generally used as an etching gas. However, a conventional organic resist film has properties of being easily etched with the oxygen gas and the etching rate thereof is much higher than that of the light-shielding film mainly containing Cr. Since the resist film should remain until completion of patterning, by dry etching, of the light-shielding film mainly containing Cr, the thickness of the resist film in the case of the light-shielding film mainly containing Cr is required to be very large (e.g. three times the thickness of the light-shielding film mainly containing Cr).

In recent years, the pattern miniaturization has been significant and there have been instances where, in a resist film having a transfer pattern formed by EB writing or the like, the height or thickness of the resist film is much greater than the width thereof at its portion where the pattern is dense, so that the resist film collapses or is stripped due to its instability during development or the like. If this occurs, the transfer pattern is not correctly formed in a light-shielding film mainly containing Cr, thus resulting in a defective photomask. Therefore, the reduction in thickness of the resist film has been the overriding subject to be solved. For reducing the thickness of the resist film in the case of the light-shielding film mainly containing Cr, it has been necessary to reduce the thickness of the light-shielding film. However, for the light-shielding film mainly containing Cr, its thickness has already reached a limit where the light-shielding performance becomes insufficient.

Japanese Unexamined Patent Application Publication (JP-A) No. S57-161857 (Patent Document 1) proposes a metal film mainly containing Ta (tantalum) as one of light-shielding films to be used instead of a Cr light-shielding film. Patent Document 1 discloses a mask blank having a structure in which a Ta metal layer and a mixed layer of Ta nitride (tantalum nitride) and Ta oxide (tantalum oxide) are stacked in this order on a light-transmissive substrate. Further, Japanese Unexamined Patent Application Publication (JP-A) No. 2006-78825 (Patent Document 2) discloses that a Ta metal film has an extinction coefficient (light absorbance) equal to or greater than that of a Cr metal film with respect to light having a wavelength of 193 nm which is used in ArF excimer laser exposure. Patent Document 2 discloses that when using the Ta metal film as a light-shielding film of an ArF exposure photomask, the N (nitrogen) content is preferably set to 30 at % or less in terms of a reduction in light-shielding performance.

DISCLOSURE OF THE INVENTION

However, it has been found, for example, that when fabricating a photomask adapted for exposing a fine pattern with a line width of 70 nm or less by the use of ArF exposure light, a desired fine pattern cannot be formed satisfactorily only with the use of a photomask blank having a known light-shielding film formed by using a material mainly containing Ta as described above.

In view of this, the present inventor has first studied the conditions required for a light-shielding film and so on of a photomask blank that can be formed into a photomask capable of exposing a fine pattern with a line width of 70 nm or less by the use of ArF exposure light, and has found as follows:

(a) When the width of a resist pattern becomes ⅓ or less of the thickness of a resist film, a problem such as collapse or stripping of the resist pattern occurs and, therefore, it is necessary to set the relationship between the width of the resist pattern and the thickness of the resist film so as to prevent the occurrence thereof.

(b) The resist should remain until etching of a light-shielding film is finished and further until additional etching for adjusting the shape of a pattern is finished and, practically, nonuniformity of the etching rate due to the difference in pattern width is also taken into account, and therefore, the remaining thickness of the resist is preferably about half the thickness of the resist film before the etching. In the case of using a conventional light-shielding film mainly containing Cr, since the etching rate thereof is only 0.5 to 0.6 times that of the resist under the general etching conditions, it is necessary that the thickness of the resist film be set to no less than about 200 nm. Thus, when the minimum width of the pattern becomes less than about 70 nm, it is difficult to prevent collapse of the resist pattern.

(c) On the other hand, a light-shielding film mainly containing Ta has an etching rate equal to or higher than that of the resist and further has the light-shielding performance equal to or greater than a material mainly containing Cr and, therefore, as compared with the case of using the light-shielding film mainly containing Cr, the etching is enabled with a smaller thickness of the resist film and thus it is possible to form a finer light-shielding film pattern.

(d) Herein, the optical properties required for an ArF exposure mask are cited as follows: First, the transmittance at an exposure wavelength is 0.2% or less, second, the reflectance (front-surface reflectance) of a surface of a light-shielding film is less than 30%, third, when the light-shielding film is formed on a transparent substrate, the reflectance (back-surface reflectance) measured from a surface, where the light-shielding film is not formed, of the substrate is less than 40%, and so on. This is because if the front-surface reflectance or the back-surface reflectance is large, unwanted reflected light (flare, ghost, etc.) may occur during exposure.

Then, the present inventor has studied whether or not it is possible to satisfy the above conditions with the light-shielding film mainly containing Ta, and has found as follows:

(e) At first, the transmittance being the first optical property can be controlled by adjusting the thickness of the light-shielding film. However, if the thickness thereof is increased, the thickness of the resist film should also be increased correspondingly.

(f) The front-surface reflectance being the second optical property can be controlled by forming the light-shielding film into a multilayer structure with two or more layers, wherein an antireflection layer, having transmittivity at the exposure wavelength, is formed on a light-shielding layer mainly containing Ta.

Then, the following study has been made on the control of the back-surface reflectance:

For controlling the back-surface reflectance, a method is considered in which, applying the control of the front-surface reflectance, the light-shielding film is formed into a multilayer structure with three or more layers, wherein an antireflection layer is formed on the transparent substrate. However, it has been found that some limitations occur with respect to dry etching for forming a mask pattern. That is, as a material having the optical properties suitable for the front-surface antireflection layer, there is cited a Ta-based oxide or nitride, a silicon-based oxide or nitride, a Cr-based oxide or nitride described in Patent Document 2, or the like.

Among these materials, when a Ta-based nitride is used as the front-surface antireflection layer, a sufficient antireflection effect cannot be obtained for ArF exposure light. The sufficient antireflection effect can be obtained with a Ta-based compound containing oxygen or a silicon-based oxide or nitride and, therefore, as the front-surface antireflection layer, it is necessary to use a Ta-based oxide in the case of using a Ta-based compound, or a silicon-based oxide or nitride.

When the light-shielding layer mainly containing Ta is dry-etched with a chlorine gas containing no oxygen, a high etching rate can be obtained. However, it has properties such that when its surface is oxidized, the etching rate decreases significantly. For example, when a Cr-based material is used as the front-surface antireflection layer, a chlorine gas containing oxygen is used for etching this front-surface antireflection layer. Therefore, during this etching, the surface of a portion to be etched for forming a pattern of the light-shielding layer mainly containing Ta is oxidized by oxygen contained in the etching gas, thus resulting in a reduction of the etching rate in etching of the light-shielding layer. Accordingly, it is undesirable to use the Cr-based material as the front-surface antireflection layer.

As described above, as the front-surface antireflection layer, it is necessary to use a material that can be etched with a gas containing no oxygen, while, the above Ta-based oxide also satisfies this condition. However, in the case of the Ta-based oxide, a high etching rate cannot be obtained by dry etching using a chlorine gas containing no oxygen, but can be obtained by dry etching using a fluorine-based gas containing no oxygen. Therefore, it becomes necessary to use the fluorine-based gas as an etching gas. Accordingly, for dry-etching, with a small resist thickness, the Ta-based light-shielding film with a controlled front-surface reflectance formed by stacking the Ta oxide layer as the front-surface antireflection layer on the Ta-based light-shielding layer, an etching process using the fluorine-based gas and an etching process using the chlorine gas are performed in combination.

Therefore, if the same material as that of the front-surface antireflection layer is used as means for controlling the back-surface reflectance, another etching process is further added. This increases uncertainty of the processes, complicates the structure of an apparatus to be used, and increases not a little the manufacturing cost. Further, since a synthetic quartz glass generally used as a transparent substrate of an ultraviolet light mask can be etched with the fluorine-based gas, if the back-surface antireflection layer formed on the transparent substrate is etched with the fluorine-based gas, there occurs a phenomenon that the glass is damaged, which causes an adverse influence on exposure.

In view of this, as a result of studying a material that does not need such an etching gas for etching thereof and is still capable of obtaining the back-surface antireflection effect, it has been found that Ta nitride is optimal. It has been found that although Ta nitride does not have sufficient optical properties for ArF exposure light as the front-surface antireflection layer, it exhibits a sufficient antireflection effect as the back-surface antireflection layer formed on the transparent substrate made of synthetic quartz or the like and, by adjusting the N content of the Ta nitride layer, it is fully possible to set the back-surface reflectance to less than 40%. Further, it has been found that, by adjusting the composition of Ta nitride, sufficient light-shielding performance can be obtained as the light-shielding layer and, simultaneously, sufficient antireflection performance can be obtained as the back-surface antireflection layer, and therefore, since the functions of the light-shielding layer and the back-surface antireflection layer can be achieved by the single layer, it is possible to realize a light-shielding film with a two-layer structure in which the back-surface antireflection layer is omitted.

Accordingly, various experiments were conducted on Ta nitride films and it has been found that the back-surface reflectance decreases as the N content of the Ta nitride film increases, while, if the Ta nitride film is excessively nitrided, it becomes a polycrystalline film with an extremely large surface roughness Rms. It has been found that if the surface roughness is large, pattern edge (side wall) portions after patterning become coarse to adversely affect the accuracy of pattern transfer particularly in the case of a narrow pattern width. On the other hand, it has been found that if nitriding is insufficient, the back-surface antireflection performance becomes insufficient and, further, oxidation of the pattern side walls is expected in a pattern forming process and in a long-term use of a mask. The oxidation of the pattern side walls causes a change in pattern size and deformation of a substrate due to the occurrence of stress.

This invention has been made on the basis of the above analysis results and has an object to provide a photomask blank that enables formation of an extremely fine pattern, and a photomask obtained by forming the fine pattern in the photomask blank.

In order to achieve the above object, this invention has the following aspects.

(First Aspect)

There is provided a photomask blank for forming a photomask adapted to ArF excimer laser exposure light, the photomask blank having a light-shielding film comprising at least two layers on a transparent substrate, wherein the light-shielding film comprises:

a light-shielding layer made of a material mainly containing tantalum nitride and containing less than 62 at % nitrogen, the material capable of being dry-etched with a chlorine-based gas containing no oxygen; and a front-surface antireflection layer formed on the light-shielding layer, the front-surface antireflection layer being made of a material not capable of being dry-etched with a chlorine-based gas and capable of being dry-etched with a fluorine-based gas.

(Second Aspect)

The light-shielding layer is preferably made of a material mainly containing tantalum nitride and containing 7 at % or more nitrogen in the photomask blank according to the first aspect.

(Third Aspect)

The light-shielding film preferably has a thickness of less than 65 nm in the photomask blank according to the first aspect.

(Fourth Aspect)

The front-surface antireflection layer is preferably made of a material mainly containing tantalum oxide in the photomask blank according to the first aspect.

(Fifth Aspect)

The front-surface antireflection layer preferably mainly contains tantalum oxide and contains 50 at % or more oxygen according to the fourth aspect.

(Sixth Aspect)

The front-surface antireflection layer preferably has a thickness of 5 nm or more and 20 nm or less in the photomask blank according to the first aspect.

(Seventh Aspect)

The light-shielding film preferably has a transmittance of 0.2% or less and a back-surface reflectance of less than 40% with respect to the ArF excimer laser exposure light in the photomask blank according to the first aspect.

(Eighth Aspect)

The light-shielding film preferably has a stacked structure comprising the light-shielding layer made of a material having a refractive index n of more than 1.65 and less than 2.44 and an extinction coefficient k of more than 1.70 and less than 2.50 and the front-surface antireflection layer made of a material having a refractive index n of 2.23 or more and 2.42 or less and an extinction coefficient k of 0.63 or more and 1.09 or less in the photomask blank according to the first aspect.

(Ninth Aspect)

At least one of the light-shielding layer and the front-surface antireflection layer is preferably made of a material containing boron in the photomask blank according to the first aspect.

(Tenth Aspect)

There is provided a photomask wherein a transfer pattern is formed in the light-shielding film of the photomask blank according to the first aspect.

(Eleventh Aspect)

There is provided a method of manufacturing a photomask in which a transfer pattern is formed in the light-shielding film of the photomask blank according to the first aspect, comprising:

dry-etching the front-surface antireflection layer with a fluorine-based gas containing no oxygen using, as an etching mask, a resist film having the transfer pattern; and after dry-etching the front-surface antireflection layer, dry-etching the light-shielding layer with a chlorine-based gas containing no oxygen using, as an etching mask, at least one of the resist film and the front-surface antireflection layer.

In the above aspects, the light-shielding layer mainly contains Ta nitride (tantalum nitride) and contains less than 62 at % N (nitrogen). This makes it possible to suppress the back-surface reflectance of the light-shielding film to less than 40%. Preferably, the light-shielding layer contains 7 at % or more N.

More preferably, the light-shielding layer mainly contains Ta nitride and contains 51 at % or less N. In this invention, the N content in a material mainly containing Ta nitride is based on the analysis value according to XPS (X-ray photoelectron spectroscopy) analysis. Therefore, there is a possibility that it slightly differs from the N content based on the analysis value according to another analysis method such as RBS (Rutherford Backscattering Spectrometry) analysis.

In the above aspect, when a material mainly containing Ta oxide (tantalum oxide) is selected as a material of the front-surface antireflection layer, the front-surface antireflection effect increases as the O (oxygen) content increases, and the O content is preferably 50 at % or more. The thickness of the front-surface antireflection layer that can achieve a sufficient antireflection effect depends on the N content of the underlying light-shielding layer (layer mainly containing Ta nitride) and, when an ArF excimer laser (wavelength: 193 nm) is used for exposure, it is adjusted in the range of 5 to 20 nm. When a material mainly containing Si (silicon) oxide or nitride is used as the front-surface antireflection layer, the extinction coefficient k is adjusted to 1.4 or less and more preferably 1.2 or less by increasing the O or N content. When forming the front-surface antireflection layer by DC sputtering being a general film forming method, a metal may be added for the purpose of ensuring the conductivity of a sputtering target to improve the film forming stability and the discharge stability. As an addition metal suitable for the Si-based front-surface antireflection layer, Mo (molybdenum) is cited and its addition amount is preferably less than 20 at %. As the N content increases, Ta nitride used as the light-shielding layer increases in back-surface antireflection effect but decreases in light-shielding performance, and thus, the thickness of the light-shielding film increases to require a greater resist film thickness, which is not preferable. Accordingly, the thickness of the entire light-shielding film is preferably set to less than 65 nm. For setting the thickness of the entire light-shielding film to less than 65 nm, the thickness of the light-shielding layer made of a material with a high extinction coefficient k is preferably set to 40 nm or more.

The thickness of the light-shielding layer is adjusted so that the transmittance of the light-shielding film becomes a required value. Normally, the adjustment is made so that the transmittance at a wavelength of ArF exposure light becomes 0.1% or less. However, depending on exposure conditions such as a specification of an exposure apparatus and sensitivity of a resist film of a transfer target, there is a case where the transmittance is allowed to be higher than 0.1% and, in such a case, the thickness of the light-shielding layer may be adjusted so that the transmittance of the light-shielding film for ArF exposure light becomes about 0.2%.

In order to sufficiently reduce the back-surface reflectance and yet to obtain sufficient light-shielding performance with a thin film thickness, it may be configured to form, on the transparent substrate, a layer mainly containing Ta nitride with a relatively high N content and having a thickness in the range of 5 to 15 nm, then to form a layer mainly containing Ta nitride with a relatively low N content and having a thickness capable of sufficiently reducing the transmittance of the light-shielding film, and further to form an antireflection layer mainly containing Ta oxide. Also in this case, the N content of each of the layers mainly containing Ta nitride is adjusted to less than 62 at %. Further, the thicknesses of the two layers mainly containing Ta nitride are adjusted so that the transmittance of the entire light-shielding film becomes 0.1%. In the above three-layer structure, there is a problem that if the intermediate light-shielding layer is in the form of a Ta metal layer containing no N at all, the light-shielding performance becomes high, but since the Ta metal is easily oxidized in the atmosphere, if the side walls are exposed after mask pattern formation, the line width changes with time. Therefore, in the case of using Ta in the light-shielding layer, N is preferably contained regardless of the layer structure.

B (boron), C (carbon), Si (silicon), or the like may be added to the layer mainly containing Ta nitride for improving the smoothness of the light-shielding film. Since these elements each reduce the light-shielding performance or the etching performance of the Ta metal, the addition amount thereof is preferably set to 20 at % or less. Specifically, if B or C is added, the light-shielding performance of the layer mainly containing Ta nitride decreases, while, if C or Si is added, the etching rate thereof decreases. B may also be added to the Ta oxide antireflection layer for improving the smoothness of the light-shielding film. B has only a small influence on the antireflection performance and the etching characteristics being the subject of this invention. It is said that the smoothness of the light-shielding film affects the edge roughness in pattern formation. Besides, if the surface roughness of the light-shielding film is large, surface-roughness shapes are detected as defects and, therefore, there arises a problem that the detection sensitivity for foreign matter cannot be enhanced, so that the quality control of photomask blanks becomes difficult. In the experiments leading to this invention, M1350 (trade name) manufactured by Lasertec Corporation was used as a defect inspection apparatus, wherein, with respect to a light-shielding film with a surface roughness Rms of as large as 0.84 nm, surface-roughness shapes were erroneously detected as defects even at a portion where there were no foreign matter. Therefore, in the case of using this defect inspection apparatus, the Rms value of the surface of the light-shielding film needs to be less than 0.84 nm so as to prevent the reduction in inspection sensitivity due to the surface roughness. Also in the case of using another defect inspection apparatus, it is necessary to adjust the surface roughness of the light-shielding film by adjusting the N content or adding B, C, Si, or the like so as to achieve the Rms value small enough to prevent the defect inspection apparatus from erroneously judging surface-roughness shapes to be defects. As a gas added in sputtering the layer mainly containing Ta oxide, use may be made of a gas containing oxygen such as $CO_2$, $NO_2$, or NO instead of $O_2$. In this event, there is a case where C or N is contained in the film, but C or N has only a small influence on the antireflection performance and the etching rate of the Ta oxide layer.

Further, by forming the light-shielding film into a stacked structure comprising the light-shielding layer made of a material having a refractive index n of more than 1.65 and less than 2.44 and an extinction coefficient k of more than 1.70 and less than 2.50 and the front-surface antireflection layer made of a material having a refractive index n of 2.23 or more and 2.42 or less and an extinction coefficient k of 0.63 or more and 1.09 or less, even if the thickness of the entire light-shielding film is less than 65 nm, it is possible to satisfy all the conditions of a transmittance of 0.2% or less, a front-surface reflectance of less than 30%, and a back-surface reflectance of less than 40% with respect to ArF excimer laser exposure light. It is more preferable that a material having a refractive index n of 1.80 or more and 2.35 or less and an extinction coefficient k of 1.85 or more and 2.37 or less be selected as the light-shielding layer.

According to the above aspect, by adjusting the N content in the light-shielding layer, mainly containing Ta nitride, of the light-shielding film to less than 62 at % and providing the front-surface antireflection layer as an upper layer on the light-shielding layer, the surface roughness of the entire light-shielding film can be set in the optimal range and oxidation of Ta of the light-shielding layer can be suppressed so that etching thereof is enabled with a chlorine-based gas. Further, since the surface roughness of the light-shielding film is small, the line edge roughness of the light-shielding film after patterning can be made small. Simultaneously, the light-shielding performance of the light-shielding film can be set in a range that does not adversely affect the transfer accuracy.

Further, with these effects, even in the case of a fine-line transfer pattern, it can be transferred onto a wafer with high accuracy. Further, with the entire light-shielding film, it is possible to achieve a transmittance of 0.2% or less, a front-surface reflectance of less than 30%, and a back-surface reflectance of less than 40% with respect to ArF exposure light (wavelength: 193 nm). Further, by enabling the light-shielding layer to be dry-etched with a chlorine-based gas (a chlorine-based gas containing substantially no oxygen, i.e. including a chlorine-based gas containing oxygen in an amount not affecting a resist film and so on during dry etching) and enabling the front-surface antireflection layer to be dry-etched with a fluorine-based gas, but not with the chlorine-based gas (including a case where the front-surface antireflection layer is slightly etched by physical etching with the chlorine-based gas to an extent that does not affect the function of the front-surface antireflection layer), it is possible to dry-etch the light-shielding layer with the chlorine-based gas ($Cl_2$, $SiCl_4$, $CHCl_3$, $CCl_4$, or the like) containing substantially no oxygen, using the front-surface antireflection layer as a hard mask. Accordingly, it is sufficient for the resist film to remain until completion of a process of forming a transfer pattern in the front-surface antireflection layer by dry etching with the fluorine-based gas ($CF_4$, $CHF_3$, $SF_6$, $C_4F_8$, or the like) and, therefore, it is possible to achieve a further reduction in thickness of the resist film. Particularly, in the case of a photomask blank according to the fourth aspect, the front-surface antireflection layer is made of a material mainly containing Ta oxide and, therefore, the light-shielding layer and the front-surface antireflection layer can be sputtered with the same sputtering target, by the use of a sputtering apparatus having a single sputtering chamber, only by changing the kind of gas introduced into the sputtering chamber during sputtering. Thus, the manufacturing cost can be largely reduced. Further, particularly in the case of a photomask blank according to the ninth aspect, the surface roughness of the entire light-shielding film can be reduced by adding B to the light-shielding layer and/or the front-surface antireflection layer and, therefore, there is an effect of preventing erroneous recognition of defects on a surface of the photomask blank by a defect inspection apparatus and thus achieving a reduction in inspection time.

DESCRIPTION OF THE EXEMPLARY EMBODIMENT

Figure 1:
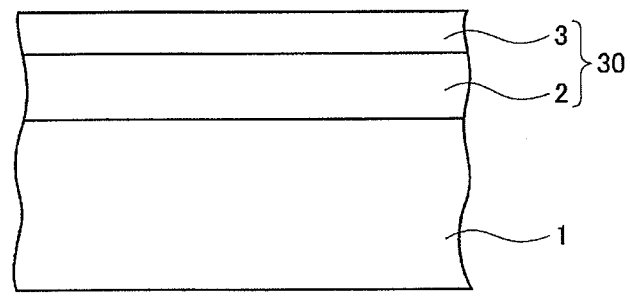
FIG. 1 is a sectional view illustrating the structure of a photomask blank according to an embodiment of this invention.
Figure 2:
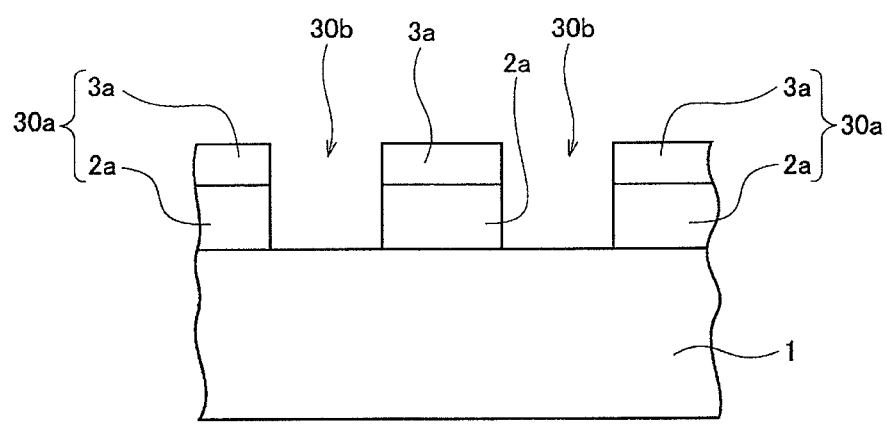
FIG. 2 is a sectional view illustrating the structure of a photomask according to the embodiment of this invention.

FIG. 1 is a sectional view illustrating the structure of a photomask blank according to an embodiment of this invention, FIG. 2 is a sectional view illustrating the structure of a photomask according to the embodiment of this invention, and FIGS. 3A to 3G are sectional views showing processes of manufacturing the photomask blank and the photomask according to the embodiment of this invention. Hereinbelow, referring to these figures, the photomask blank and the photomask according to the embodiment of this invention will be described.

As shown in FIG. 1, the photomask blank according to this embodiment is configured such that a Ta nitride layer (light-shielding layer) 2 mainly containing Ta nitride and having a thickness of 42.4 nm is formed on a glass substrate 1 made of synthetic quartz and a Ta oxide layer (front-surface antireflection layer) 3 mainly containing Ta oxide and having a thickness of 11 nm is formed on the Ta nitride layer 2. The Ta nitride layer 2 and the Ta oxide layer 3 form a light-shielding film 30. The N content of the Ta nitride layer 2 is 16 at % and the O content of the Ta oxide layer 3 is 58 at %. As shown in FIG. 2, the photomask according to this embodiment is configured such that the light-shielding film 30 of the photomask blank shown in FIG. 1 is formed with a fine pattern comprising portions 30a where the light-shielding film 30 is left remaining and portions 30b where the light-shielding film 30 is removed.

Next, referring to FIGS. 3A to 3G, a description will be given of an Example of manufacturing the photomask blank and the photomask according to this embodiment.

Example 1

A substrate 1 made of synthetic quartz and having an about 152 mm×152 mm square size with a thickness of 6.35 mm was introduced into a DC magnetron sputtering apparatus. After the inside of the sputtering apparatus was evacuated to $2\times10^{-5}$ (Pa) or less, a mixed gas (sputtering gas) of Ar and $N_2$ was introduced into the sputtering apparatus. In this event, the flow rate of Ar and the flow rate of $N_2$ were adjusted to 38.5 sccm and 9 sccm, respectively. Ta was used as a sputtering target. After the gas flow rates were stabilized, the power of a DC power supply was set to 1.5 kW, thereby forming a Ta nitride layer 2 having a thickness of 42.4 nm on the substrate 1 (see FIG. 3A).

Figure 3A:
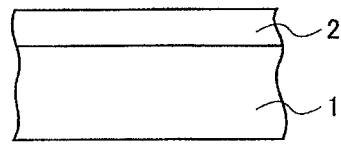
FIGS. 3A to 3G are sectional views showing processes of manufacturing the photomask blank and the photomask according to the embodiment of this invention.
Figure 3B:
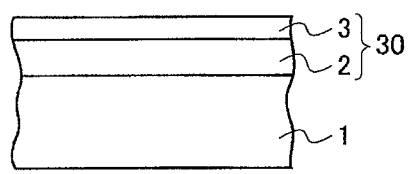
Figure 3C:
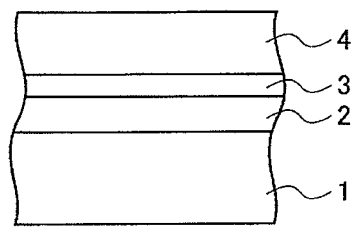

Then, while the substrate 1 formed with the Ta nitride layer 2 was maintained in the sputtering apparatus, a mixed gas (sputtering gas) containing an Ar gas at a flow rate of 58 sccm and an $O_2$ gas at a flow rate of 32.5 sccm was introduced into the sputtering apparatus and then the power of the DC power supply was set to 0.7 kW, thereby stacking a Ta oxide layer 3 having a thickness of 11 nm on the Ta nitride layer 2 (see FIG. 3B). When forming the Ta oxide layer 3 by DC magnetron sputtering, it may happen that an oxide film is deposited on the sputtering target to reduce the film forming rate. For suppressing the reduction in film forming rate, a DC pulse unit is effective. In this Example, use was made of Sparc-LE V (trade name) manufactured by Advanced Energy Industries, Inc.

The reflectance (front-surface reflectance) of a surface, remote from the substrate 1, of a light-shielding film 30 thus formed was 19.6% for ArF exposure light (wavelength: 193 nm). The reflectance (back-surface reflectance) of a surface, where the light-shielding film 30 was not formed, of the substrate 1 was 35.0% for ArF exposure light. Further, the transmittance for ArF exposure light was 0.1%. Values of refractive index n and extinction coefficient k were calculated using n&k 1280 (trade name), an optical thin-film property measuring apparatus, manufactured by n&k Technology, Inc., wherein the refractive index n and the extinction coefficient k of the Ta nitride layer 2 were 2.00 and 2.22, respectively, and the refractive index n and the extinction coefficient k of the Ta oxide layer 3 were 2.23 and 1.09, respectively. Further, XPS (X-ray photoelectron spectroscopy) analysis was performed for an evaluation light-shielding film formed in the same manner, wherein the N content of the Ta nitride layer 2 was 16 at % and the O content of the Ta oxide layer 3 was 58 at %. Further, the surface roughness in a 1 μm square area of the evaluation light-shielding film was measured using an AFM (atomic force microscope) and the value of Rms was 0.29 nm. Further, defect inspection was conducted using M1350 (trade name), a defect inspection apparatus, manufactured by Lasertec Corporation and it was confirmed that it was possible to identify defects normally.

Figure 3D:
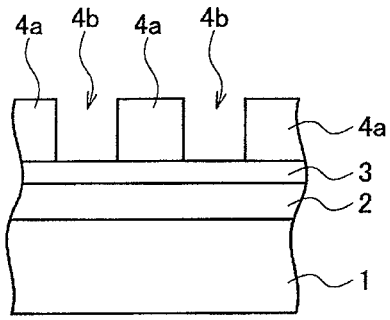

Then, an electron-beam resist 4 was coated to a thickness of 150 nm on the Ta oxide layer 3 of the light-shielding film 30 formed on the substrate 1 (see FIG. 3C) and then EB writing and development were carried out, thereby forming a resist pattern (see FIG. 3D). In FIG. 3D, symbols 4a and 4b respectively denote resist remaining portions and resist removed portions after the development and the resist pattern is formed by the resist remaining portions 4a and the resist removed portions 4b.

Figure 3E:
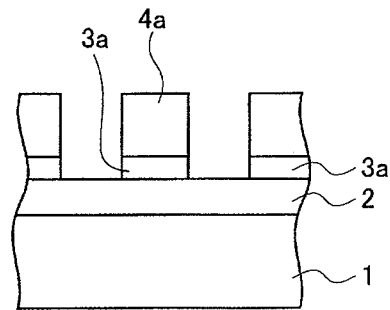
Figure 3F:
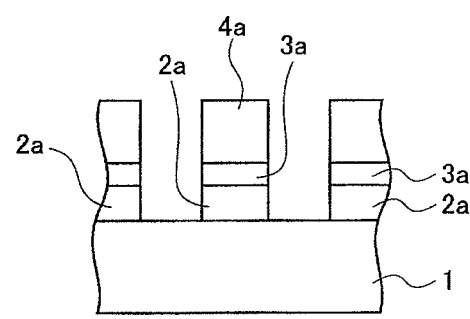
Figure 3G:
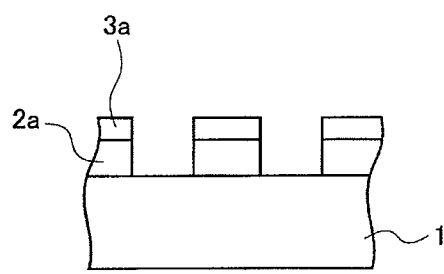

Then, dry etching using a fluorine-based ($CHF_3$) gas was carried out, thereby forming a pattern of the Ta oxide layer 3 (see FIG. 3E). In FIG. 3E, symbol 3a denotes Ta oxide layer remaining portions in the pattern of the Ta oxide layer 3. Subsequently, dry etching using a chlorine-based ($Cl_2$) gas was carried out, thereby forming a pattern of the Ta nitride layer 2. Further, 30% additional etching was carried out, thereby forming a light-shielding film pattern on the substrate 1 (see FIG. 3F). In FIG. 3F, symbol 2a denotes Ta nitride layer remaining portions in the pattern of the Ta nitride layer 2. SEM cross-section observation was carried out for the light-shielding film pattern thus formed, wherein the electron-beam resist remained with a thickness of about 80 nm. Then, the resist on the light-shielding film pattern was removed, thereby obtaining a light-shielding film pattern as a photomask pattern (see FIG. 3G).

The film structure, the manufacturing conditions, and so on of the photomask blank according to Example 1 are collectively shown in Table 1.

TABLE 1

| Configuration of Example 1 | Material | Thickness (nm) | Introduced Gas during Sputtering | | |
|---|---|---|---|---|---|
| | | | Ar (sccm) | $N_2$ (sccm) | $O_2$ (sccm) |
| Front-Surface Antireflection Layer | Ta—O | 11 | 58 | 0 | 32.5 |
| Light-Shielding Layer | Ta—N | 42.4 | 38.5 | 9 | 0 |

Further, the optical properties and so on of the photomask blank according to Example 1 are collectively shown in Table 2.

TABLE 2

| | Properties of Example 1 | | | | | | |
| --- | --- | --- | --- | --- | --- | --- | --- |
| | Optical Properties | | | | Composition | | Surface |
| | Front-Surface Reflectance | Back-Surface Reflectance | n | k | Transmittance | N Content (at %) | O Content (at %) | Roughness Rms (nm) |
| Front-Surface Antireflection Layer | 19.6% | 35.0% | 2.23 | 1.09 | 0.1% | 0 | 58 | 0.29 |
| Light-Shielding Layer | | | 2.00 | 2.22 | | 16 | 0 | |

Example 2

A photomask blank and a photomask according to Example 2 differ from Example 1 only in specific manufacturing conditions, but are the same in manufacturing sequence and so on. Therefore, specific manufacturing conditions and so on are shown in Table 3 to enable comparison with Example 1 and detailed explanation is omitted.

TABLE 3

| Configuration of Example 2 | Material | Thickness (nm) | Introduced Gas during Sputtering | | |
| --- | --- | --- | --- | --- | --- |
| | | | Ar (sccm) | $N_2$ (sccm) | $O_2$ (sccm) |
| Front-Surface Antireflection Layer | Ta—O | 13 | 58 | 0 | 32.5 |
| Light-Shielding Layer | Ta—N | 44.2 | 30 | 20 | 0 |

Further, the optical properties and so on of the photomask blank according to Example 2 are collectively shown in Table 4. Defect inspection was conducted using M1350 (trade name) manufactured by Lasertec Corporation and it was confirmed that it was possible to identify defects normally.

TABLE 4

| | Properties of Example 2 | | | | | | |
| --- | --- | --- | --- | --- | --- | --- | --- |
| | Optical Properties | | | | Composition | | Surface |
| | Front-Surface Reflectance | Back-Surface Reflectance | n | k | Transmittance | N Content (at %) | O Content (at %) | Roughness Rms (nm) |
| Front-Surface Antireflection Layer | 19.6% | 30.4% | 2.23 | 1.09 | 0.1% | 0 | 58 | 0.28 |
| Light-Shielding Layer | | | 2.20 | 2.05 | | 32 | 0 | |

Example 3

A photomask blank and a photomask according to Example 3 differ from Examples 1 and 2 only in specific manufacturing conditions, but are the same in manufacturing sequence and so on. Therefore, specific manufacturing conditions and so on are shown in Table 5 to enable comparison with Examples 1 and 2 and detailed explanation is omitted.

TABLE 5

| Configuration of Example 3 | Material | Thickness (nm) | Introduced Gas during Sputtering | | |
|---|---|---|---|---|---|
| | | | Ar (sccm) | $N_2$ (sccm) | $O_2$ (sccm) |
| Front-Surface Antireflection Layer | Ta—O | 17 | 58 | 0 | 32.5 |
| Light-Shielding Layer | Ta—N | 46.2 | 20 | 35 | 0 |

Further, the optical properties and so on of the photomask blank according to Example 3 are collectively shown in Table 6. Defect inspection was conducted using M1350 (trade name) manufactured by Lasertec Corporation and it was confirmed that it was possible to identify defects normally.

TABLE 6

| | Properties of Example 3 | | | | | | | |
|---|---|---|---|---|---|---|---|---|
| | Optical Properties | | | | | Composition | | Surface |
| | Front-Surface Reflectance | Back-Surface Reflectance | n | k | Transmittance | N Content (at %) | O Content (at %) | Roughness Rms (nm) |
| Front-Surface Antireflection Layer | 20.1% | 26.4% | 2.23 | 1.09 | 0.1% | 0 | 58 | 0.31 |
| Light-Shielding Layer | | | 2.35 | 1.85 | | 51 | 0 | |

Example 4

A photomask blank and a photomask according to Example 4 differ from Examples 1, 2, and 3 only in specific manufacturing conditions, but are the same in manufacturing sequence and so on. Therefore, specific manufacturing conditions and so on are shown in Table 7 to enable comparison with Examples 1, 2, and 3 and detailed explanation is omitted.

TABLE 7

| Configuration of Example 4 | Material | Thickness (nm) | Introduced Gas during Sputtering | | |
|---|---|---|---|---|---|
| | | | Ar (sccm) | $N_2$ (sccm) | $O_2$ (sccm) |
| Front-Surface Antireflection Layer | Ta—O | 10.5 | 58 | 0 | 32.5 |
| Light-Shielding Layer | Ta—N | 40.5 | 39.5 | 3 | 0 |

Further, the optical properties and so on of the photomask blank according to Example 4 are collectively shown in Table 8. Defect inspection was conducted using M1350 (trade name) manufactured by Lasertec Corporation and it was confirmed that it was possible to identify defects normally.

TABLE 8

| | Properties of Example 4 | | | | | | | |
|---|---|---|---|---|---|---|---|---|
| | Optical Properties | | | | | Composition | | Surface |
| | Front-Surface Reflectance | Back-Surface Reflectance | n | k | Transmittance | N Content (at %) | O Content (at %) | Roughness Rms (nm) |
| Front-Surface Antireflection Layer | 18.9% | 39.9% | 2.23 | 1.09 | 0.1% | 0 | 58 | 0.48 |
| Light-Shielding Layer | | | 1.80 | 2.37 | | 7 | 0 | |

Comparative Example 1

A light-shielding film was formed in the same manner as in Example 1 except that, for confirming the effect of adding N to form the Ta nitride layer (light-shielding layer) 2 in Example 1, a Ta metal light-shielding layer not containing N was formed on a substrate by sputtering using no $N_2$ gas. With respect to a photomask blank of Comparative Example 1, the reflectance (back-surface reflectance) of a surface, where the light-shielding film was not formed, of the substrate was measured and the back-surface reflectance for ArF exposure light was 44.3%, the value unsuitable for use as a photomask. Further, a photomask with a transfer pattern was fabricated from the photomask blank of Comparative Example 1 in the same sequence as in Example 1 and then was left standing in the atmosphere. Then, the Ta metal light-shielding layer at pattern edge portions started to be oxidized with time. Accordingly, the pattern width changes due to the oxidation of the pattern edge portions so that the pattern accuracy is largely lowered. It has been found that the photomask blank of Comparative Example 1 is not suitable for fabricating the photomask. The manufacturing conditions and so on of Comparative Example 1 are collectively shown in Table 9.

TABLE 9

| Configuration of Comparative Example 3 | Material | Thickness (nm) | Introduced Gas during Sputtering | | |
|---|---|---|---|---|---|
| | | | Ar (sccm) | $N_2$ (sccm) | $O_2$ (sccm) |
| Front-Surface Antireflection Layer | Ta—O | 10 | 58 | 0 | 32.5 |
| Light-Shielding Layer | Ta | 39 | 40 | 0 | 0 |

Further, the optical properties and so on of the photomask blank according to Comparative Example 1 are collectively shown in Table 10.

Example 2 was measured using an AFM and the value of Rms was 0.84 nm, meaning that the surface roughness extremely increased as compared with Example 1. Defect inspection was conducted for the light-shielding film of Comparative Example 2 using M1350 (trade name) manufactured by Lasertec Corporation, wherein small-size defects were observed over the entire surface of the substrate. An inspection image was confirmed for the observed defects and it was found that no foreign matter or pinholes were present and the observed defects were false defects caused by the increased surface roughness. Further, a pattern was formed in the light-shielding film of a photomask blank of Comparative Example 2, wherein the edge roughness at pattern side wall portions increased, thus resulting in a photomask with low pattern accuracy.

The manufacturing conditions and so on of Comparative Example 2 are collectively shown in Table 11.

TABLE 11

| Configuration of Comparative Example 2 | Material | Thickness (nm) | Introduced Gas during Sputtering | | |
|---|---|---|---|---|---|
| | | | Ar (sccm) | $N_2$ (sccm) | $O_2$ (sccm) |
| Front-Surface Antireflection Layer | Ta—O | 18 | 58 | 0 | 32.5 |
| Light-Shielding Layer | Ta—N | 49.3 | 0 | 60 | 0 |

Further, the optical properties and so on of the photomask blank according to Comparative Example 2 are collectively shown in Table 12.

TABLE 10

| | Properties of Comparative Example 1 | | | | | | |
|---|---|---|---|---|---|---|---|
| | Optical Properties | | | | Composition | | Surface |
| | Front-Surface Reflectance | Back-Surface Reflectance | n | k | Transmittance | N Content (at %) | O Content (at %) | Roughness Rms (nm) |
| Front-Surface Antireflection Layer | 18.8% | 44.3% | 2.23 | 1.09 | 0.1% | 0 | 58 | 0.55 |
| Light-Shielding Layer | | | 1.65 | 2.50 | | 0 | 0 | |

Comparative Example 2

A light-shielding film was formed in the same manner as in Example 1 except that, for confirming the influence of excessively adding N to form a Ta nitride layer 2, the flow rate of a $N_2$ gas was largely increased when sputtering the Ta nitride layer 2 on a substrate 1. The surface roughness in a 1 μm square area of the light-shielding film of Comparative

TABLE 12

Properties of Comparative Example 2

| | Optical Properties | | | | Composition | | Surface |
| --- | --- | --- | --- | --- | --- | --- | --- |
| | Front-Surface Reflectance | Back-Surface Reflectance | n | k | Transmittance | N Content (at %) | O Content (at %) | Roughness Rms (nm) |
| Front-Surface Antireflection Layer | 20.8% | 18.9% | 2.23 | 1.09 | 0.1% | 0 | 58 | 0.84 |
| Light-Shielding Layer | | | 2.44 | 1.70 | | 62 | 0 | |

Comparative Example 3

For confirming the antireflection effect of the Ta oxide layer (front-surface antireflection layer) 3 formed on the surface of the Ta nitride layer (light-shielding layer) 2 in Example 1, there was formed a light-shielding film comprising only a Ta nitride layer with no Ta oxide layer. The reflectance (front-surface reflectance) of a surface, remote from a substrate, of the light-shielding film of Comparative Example 3 was measured and the front-surface reflectance for ArF exposure light was 42.5%, the value unsuitable for use as a photomask. The film structure, the manufacturing conditions, and so on of Comparative Example 3 are shown in Table 13 to enable comparison with the Examples.

TABLE 13

| Configuration of Comparative Example 3 | Material | Thickness (nm) | Introduced Gas during Sputtering | | |
| --- | --- | --- | --- | --- | --- |
| | | | Ar (sccm) | N$_2$ (sccm) | O$_2$ (sccm) |
| Light-Shielding Layer | Ta—N | 47 | 38.5 | 9 | 0 |

Further, the optical properties and so on of a photomask blank according to Comparative Example 3 are collectively shown in Table 14.

TABLE 14

Properties of Comparative Example 3

| | Optical Properties | | | | | Composition | | Surface |
| --- | --- | --- | --- | --- | --- | --- | --- | --- |
| | Front-Surface Reflectance | Back-Surface Reflectance | n | k | Transmittance | N Content (at %) | O Content (at %) | Roughness Rms (nm) |
| Light-Shielding Layer | 42.5% | 35.0% | 2.00 | 2.22 | 0.1% | 16 | 0 | 0.26 |

Comparative Example 4

In Comparative Example 4, a material mainly containing Ta nitride was used as a front-surface antireflection layer 3, but, even if the N content in the material was set to be sufficiently high, the front-surface reflectance did not become less than 30%. The manufacturing conditions and so on of Comparative Example 4 are collectively shown in Table 15.

TABLE 15

| Configuration of Comparative Example 4 | Material | Thickness (nm) | Introduced Gas during Sputtering | | |
| --- | --- | --- | --- | --- | --- |
| | | | Ar (sccm) | N$_2$ (sccm) | O$_2$ (sccm) |
| Front-Surface Antireflection Layer | Ta—N | 11 | 0 | 60 | 0 |
| Light-Shielding Layer | Ta—N | 36.4 | 39.5 | 3 | 0 |

Further, the optical properties and so on of a photomask blank according to Comparative Example 4 are collectively shown in Table 16.

TABLE 16

Properties of Comparative Example 4

| | Optical Properties | | | | | Composition | | Surface |
| | Front-Surface Reflectance | Back-Surface Reflectance | n | k | Transmittance | N Content (at %) | O Content (at %) | Roughness Rms (nm) |
|---|---|---|---|---|---|---|---|---|
| Front-Surface Antireflection Layer | 30.0% | 39.9% | 2.44 | 1.70 | 0.1% | 62 | 0 | 0.53 |
| Light-Shielding Layer | | | 1.80 | 2.37 | | 7 | 0 | |

Example 5

A substrate 1 made of synthetic quartz and having an about 152 mm×152 mm square size with a thickness of 6.35 mm was introduced into a DC magnetron sputtering apparatus. After the inside of the sputtering apparatus was evacuated to $2\times10^{-5}$ (Pa) or less, a mixed gas (sputtering gas) of Xe (xenon) and $N_2$ was introduced into the sputtering apparatus. In this event, the flow rate of Xe and the flow rate of $N_2$ were adjusted to 11 sccm and 15 sccm, respectively. Ta was used as a sputtering target. After the gas flow rates were stabilized, the power of a DC power supply was set to 1.5 kW, thereby forming a Ta nitride layer (light-shielding layer) 2 having a thickness of 44.9 nm on the substrate 1.

Then, while the substrate 1 formed with the Ta nitride layer 2 was maintained in the sputtering apparatus, a mixed gas (sputtering gas) containing an Ar gas at a flow rate of 58 sccm and an $O_2$ gas at a flow rate of 32.5 sccm was introduced into the sputtering apparatus and then the power of the DC power supply was set to 0.7 kW, thereby stacking a Ta oxide layer (front-surface antireflection layer) 3 having a thickness of 13 nm on the Ta nitride layer 2. When forming the Ta oxide layer 3 by DC magnetron sputtering, it may happen that an oxide film is deposited on the sputtering target to reduce the film forming rate. For suppressing the reduction in film forming rate, a DC pulse unit is effective. In this Example, use was made of Sparc-LE V (trade name) manufactured by Advanced Energy Industries, Inc.

The reflectance (front-surface reflectance) of a surface, remote from the substrate 1, of a light-shielding film 30 thus formed was 19.5% for ArF exposure light. The reflectance (back-surface reflectance) of a surface, where the light-shielding film 30 was not formed, of the substrate 1 was 30.3% for ArF exposure light. Further, the transmittance for ArF exposure light was 0.1%. Values of refractive index n and extinction coefficient k were calculated using n&k 1280 (trade name) manufactured by n&k Technology, Inc., wherein the refractive index n and the extinction coefficient k of the Ta nitride layer 2 were 2.16 and 2.02, respectively, and the refractive index n and the extinction coefficient k of the Ta oxide layer 3 were 2.23 and 1.09, respectively. Further, XPS analysis was performed for an evaluation light-shielding film formed in the same manner, wherein the N content of the Ta nitride layer 2 was 31 at % and the O content of the Ta oxide layer 3 was 58 at %. Further, the surface roughness in a 1 μm square area of the evaluation light-shielding film was measured using an AFM and the value of Rms was 0.49 nm. Further, defect inspection was conducted using M1350 (trade name) manufactured by Lasertec Corporation and it was confirmed that it was possible to identify defects normally.

The film structure, the manufacturing conditions, and so on of a photomask blank according to Example 5 are collectively shown in Table 17.

TABLE 17

| | Configuration of Example 5 | | | | |
| | | Thickness | Introduced Gas during Sputtering | | | |
| | Material | (nm) | Xe (sccm) | Ar (sccm) | $N_2$ (sccm) | $O_2$ (sccm) |
|---|---|---|---|---|---|---|
| Front-Surface Antireflection Layer | Ta—O | 13 | 0 | 58 | 0 | 32.5 |
| Light-Shielding Layer | Ta—N | 44.9 | 11 | 0 | 15 | 0 |

Further, the optical properties and so on of the photomask blank according to Example 5 are collectively shown in Table 18.

TABLE 18

Properties of Example 5

| | Optical Properties | | | | | Composition | | Surface |
| | Front-Surface Reflectance | Back-Surface Reflectance | n | k | Transmittance | N Content (at %) | O Content (at %) | Roughness Rms (nm) |
|---|---|---|---|---|---|---|---|---|
| Front-Surface Antireflection Layer | 19.5% | 30.3% | 2.23 | 1.09 | 0.1% | 0 | 58 | 0.49 |
| Light-Shielding Layer | | | 2.16 | 2.02 | | 31 | 0 | |

Example 6

Figure 4:
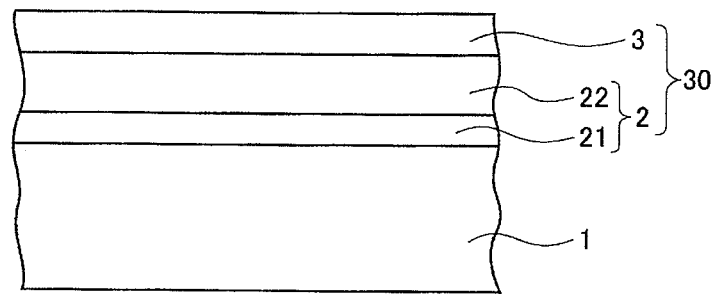
FIG. 4 is a sectional view illustrating the structure of a photomask blank according to Example 6.

FIG. 4 is a sectional view illustrating the structure of a photomask blank according to Example 6. Hereinbelow, referring to FIG. 4, the photomask blank according to Example 6 will be described. The photomask blank according to Example 6 is configured such that a first Ta nitride layer 21 having a thickness of 13 nm is formed on a glass substrate 1 made of synthetic quartz, a second Ta nitride layer 22 having a thickness of 32 nm is formed on the first Ta nitride layer 21, and a Ta oxide layer (front-surface antireflection layer) 3 having a thickness of 10 nm is formed on the second Ta nitride layer 22. The first Ta nitride layer 21 and the second Ta nitride layer 22 form a light-shielding layer 2, and the light-shielding layer 2 and the Ta oxide layer 3 form a light-shielding film 30. The N content of the first Ta nitride layer 21 is 51 at %, the N content of the second Ta nitride layer 22 is 16 at %, and the O content of the Ta oxide layer 3 is 58 at %.

The photomask blank according to Example 6 is manufactured in the following manner: As in Example 1, a substrate 1 made of synthetic quartz and having an about 152 mm×152 mm square size with a thickness of 6.35 mm was introduced into a DC magnetron sputtering apparatus. After the inside of the sputtering apparatus was evacuated to $2 \times 10^{-5}$ (Pa) or less, a mixed gas (sputtering gas) of Ar and $N_2$ was introduced into the sputtering apparatus. In this event, the flow rate of Ar and the flow rate of $N_2$ were adjusted to 20 sccm and 35 sccm, respectively. Ta was used as a sputtering target. After the gas flow rates were stabilized, the power of a DC power supply was set to 1.5 kW, thereby forming a first Ta nitride layer 21 having a thickness of 13 nm on the substrate 1. Then, while the substrate 1 formed with the first Ta nitride layer 21 was maintained in the sputtering apparatus, a mixed gas (sputtering gas) containing Ar at a flow rate of 38.5 sccm and $N_2$ at a flow rate of 9 sccm was introduced into the sputtering apparatus and then the power of the DC power supply was set to 1.5 kW, thereby stacking a second Ta nitride layer 22 having a thickness of 32 nm on the first Ta nitride layer 21.

Then, while the substrate 1 formed with the first Ta nitride layer 21 and the second Ta nitride layer 22 was maintained in the sputtering apparatus, a mixed gas (sputtering gas) containing Ar at a flow rate of 58 sccm and $O_2$ at a flow rate of 32.5 sccm was introduced into the sputtering apparatus and then the power of the DC power supply was set to 0.7 kW, thereby stacking a Ta oxide layer 3 having a thickness of 10 nm on the second Ta nitride layer 22. The reflectance (front-surface reflectance) of a surface, remote from the substrate 1, of a light-shielding film 30 with a three-layer structure thus formed was 20.6% for ArF exposure light. The reflectance (back-surface reflectance) of a surface, where the light-shielding film 30 was not formed, of the substrate 1 was 25.2% for ArF exposure light. Further, the transmittance for ArF exposure light was 0.1%.

XPS analysis was performed for an evaluation light-shielding film formed in the same manner, wherein the N content of the first Ta nitride layer 21 was 51 at %, the N content of the second Ta nitride layer 22 was 16 at %, and the content of the Ta oxide layer 3 was 58 at %. Further, the surface roughness in a 1 μm square area of the evaluation light-shielding film was measured using an AFM and the value of Rms was 0.26 nm. Further, defect inspection was conducted using M1350 (trade name) manufactured by Lasertec Corporation and it was confirmed that it was possible to identify defects normally.

The manufacturing conditions and so on of Example 6 are collectively shown in Table 19.

TABLE 19

| Configuration of Example 6 | Material | Thickness (nm) | Introduced Gas during Sputtering | | |
|---|---|---|---|---|---|
| | | | Ar (sccm) | $N_2$ (sccm) | $O_2$ (sccm) |
| Front-Surface Antireflection Layer (Ta Oxide Layer 8) | Ta—O | 10 | 58 | 0 | 32.5 |
| Light-Shielding Layer (Ta Nitride Layer 7) | Ta—N | 32 | 38.5 | 9 | 0 |
| Light-Shielding Layer (Ta Nitride Layer 6) | Ta—N | 13 | 20 | 35 | 0 |

Further, the optical properties and so on of the photomask blank according to Example 6 are collectively shown in Table 20.

TABLE 20

| | Properties of Example 6 | | | | | | | |
|---|---|---|---|---|---|---|---|---|
| | Optical Properties | | | | | Composition | | Surface |
| | Front-Surface Reflectance | Back-Surface Reflectance | n | k | Transmittance | N Content (at %) | O Content (at %) | Roughness Rms (nm) |
| Antireflection Layer (Ta Oxide Layer 8) | 20.6% | 25.2% | 2.23 | 1.09 | 0.1% | 0 | 58 | 0.26 |
| Light-Shielding Layer (Ta Nitride Layer 7) | | | 2.00 | 2.22 | | 16 | 0 | |
| Light-Shielding Layer (Ta Nitride Layer 6) | | | 2.35 | 1.85 | | 51 | 0 | |

Example 7

Figure 5:
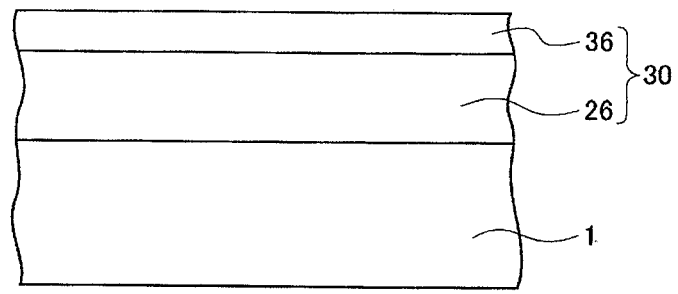
FIG. 5 is a sectional view illustrating the structure of a photomask blank according to Example 7.

FIG. 5 is a sectional view illustrating the structure of a photomask blank according to Example 7. Hereinbelow, referring to FIG. 5, the photomask blank according to Example 7 will be described. The photomask blank according to Example 7 is configured such that a Ta—B—N layer (light-shielding layer) 26 having a thickness of 45 nm is formed on a glass substrate 1 made of synthetic quartz and a Ta—B—O layer (front-surface antireflection layer) 36 having a thickness of 10 nm is formed on the Ta—B—N layer 26. The N content of the Ta—B—N layer 26 is 15 at % and the O content of the Ta—B—O layer 36 is 56 at %.

The photomask blank according to Example 7 is manufactured in the following manner: As in Example 1, a substrate 1 made of synthetic quartz and having an about 152 mm×152 mm square size with a thickness of 6.35 mm was introduced into a DC magnetron sputtering apparatus. After the inside of the sputtering apparatus was evacuated to $2 \times 10^{-5}$ (Pa) or less, a mixed gas (sputtering gas) of Ar and $N_2$ was introduced into the sputtering apparatus. In this event, the flow rate of Ar and the flow rate of $N_2$ were adjusted to 38.5 sccm and 9 sccm, respectively. A Ta—B alloy (Ta:B=80:20 atomic ratio) was used as a sputtering target. After the gas flow rates were stabilized, the power of a DC power supply was set to 1.5 kW, thereby forming a Ta—B—N layer 26 having a thickness of 45 nm on the substrate 1.

The manufacturing conditions and so on of Example 7 are collectively shown in Table 21.

TABLE 21

| Configuration of Example 7 | Material | Thickness (nm) | Introduced Gas during Sputtering | | |
|---|---|---|---|---|---|
| | | | Ar (sccm) | $N_2$ (sccm) | $O_2$ (sccm) |
| Front-Surface Antireflection Layer | Ta—B—O | 10 | 58 | 0 | 32.5 |
| Light-Shielding Layer | Ta—B—N | 45 | 38.5 | 9 | 0 |

Further, the optical properties and so on of the photomask blank according to Example 7 are collectively shown in Table 22.

TABLE 22

| | Properties of Example 7 | | | | | | |
|---|---|---|---|---|---|---|---|
| | Optical Properties | | | | Composition | | Surface |
| | Front-Surface Reflectance | Back-Surface Reflectance | n | k | Transmittance | N Content (at %) | O Content (at %) | Roughness Rms (nm) |
| Front-Surface Antireflection Layer | 18.8% | 33.8% | 2.35 | 1.05 | 0.1% | 0 | 56 | 0.26 |
| Light-Shielding Layer | | | 1.98 | 2.13 | | 15 | 0 | |

Then, while the substrate 1 formed with the Ta—B—N layer 26 was maintained in the sputtering apparatus, a mixed gas (sputtering gas) containing Ar at a flow rate of 58 sccm and $O_2$ at a flow rate of 32.5 sccm was introduced into the sputtering apparatus and then the power of the DC power supply was set to 0.7 kW, thereby stacking a Ta—B—O layer 36 having a thickness of 10 nm on the Ta—B—N layer 26. When forming the Ta—B—O layer 36 by DC magnetron sputtering, it may happen that, as in the case of the Ta oxide layer 3, an oxide film is deposited on the sputtering target to reduce the film forming rate. For suppressing the reduction in film forming rate, a DC pulse unit is effective. In this Example, use was made of Sparc-LE V (trade name) manufactured by Advanced Energy Industries, Inc.

The reflectance (front-surface reflectance) of a surface, remote from the substrate 1, of a light-shielding film 30 thus formed was 18.8% for ArF exposure light. The reflectance (back-surface reflectance) of a surface, where the light-shielding film 30 was not formed, of the substrate 1 was 33.8% for ArF exposure light. Further, the transmittance for ArF exposure light was 0.1%. XPS analysis was performed for an evaluation light-shielding film formed in the same manner, wherein the N content of the Ta—B—N layer 26 was 15 at % and the O content of the Ta—B—O layer 36 was 56 at %. Further, the surface roughness in a 1 μm square area of the evaluation light-shielding film was measured using an AFM and the value of Rms was 0.26 nm. Further, defect inspection was conducted using M1350 (trade name) manufactured by Lasertec Corporation and it was confirmed that it was possible to identify defects normally.

Example 8

A substrate 1 made of synthetic quartz and having an about 152 mm×152 mm square size with a thickness of 6.35 mm was introduced into a DC magnetron sputtering apparatus. After the inside of the sputtering apparatus was evacuated to $2 \times 10^{-5}$ (Pa) or less, a mixed gas (sputtering gas) of Xe and $N_2$ was introduced into the sputtering apparatus. In this event, the flow rate of Xe and the flow rate of $N_2$ were adjusted to 12.9 sccm and 6 sccm, respectively. A Ta—B alloy (Ta:B=80:20 atomic ratio) was used as a sputtering target. After the gas flow rates were stabilized, the power of a DC power supply was set to 1.5 kW, thereby forming a Ta—B—N layer 26 having a thickness of 46.7 nm on the substrate 1.

Then, while the substrate 1 formed with the Ta—B—N layer 26 was maintained in the sputtering apparatus, a mixed gas (sputtering gas) containing Ar at a flow rate of 58 sccm and $O_2$ at a flow rate of 32.5 sccm was introduced into the sputtering apparatus and then the power of the DC power supply was set to 0.7 kW, thereby stacking a Ta—B—O layer 36 having a thickness of 10 nm on the Ta—B—N layer 26. When forming the Ta—B—O layer 36 by DC magnetron sputtering, it may happen that, as in the case of the Ta oxide layer 3, an oxide film is deposited on the sputtering target to reduce the film forming rate. For suppressing the reduction in film forming rate, a DC pulse unit is effective. In this Example, use was made of Sparc-LE V (trade name) manufactured by Advanced Energy Industries, Inc.

The reflectance (front-surface reflectance) of a surface, remote from the substrate 1, of a light-shielding film 30 thus formed was 18.1% for ArF exposure light. The reflectance (back-surface reflectance) of a surface, where the light-shielding film 30 was not formed, of the substrate 1 was 33.7% for ArF exposure light. Further, the transmittance for ArF exposure light was 0.1%. XPS analysis was performed for an evaluation light-shielding film formed in the same manner, wherein the N content of the Ta—B—N layer 26 was 15 at % and the O content of the Ta—B—O layer 36 was 56 at %. Further, the surface roughness in a 1 μm square area of the evaluation light-shielding film was measured using an AFM and the value of Rms was 0.42 nm. Further, defect inspection was conducted using M1350 (trade name) manufactured by Lasertec Corporation and it was confirmed that it was possible to identify defects normally.

The manufacturing conditions and so on of Example 8 are collectively shown in Table 23.

TABLE 23

| | Configuration of Example 8 | | | | |
|---|---|---|---|---|---|
| | | Thick- | Introduced Gas during Sputtering | | |
| | Material | ness (nm) | Xe (sccm) | Ar (sccm) | $N_2$ (sccm) | $O_2$ (sccm) |
| Front-Surface Antireflection Layer | Ta—B—O | 10 | 0 | 58 | 0 | 32.5 |
| Light-Shielding Layer | Ta—B—N | 46.7 | 12.9 | 0 | 6 | 0 |

Further, the optical properties and so on of a photomask blank according to Example 8 are collectively shown in Table 24.

TABLE 24

| | Properties of Example 8 | | | | | | | |
|---|---|---|---|---|---|---|---|---|
| | Optical Properties | | | | | Composition | | Surface |
| | Front-Surface Reflectance | Back-Surface Reflectance | n | k | Transmittance | N Content (at %) | O Content (at %) | Roughness Rms (nm) |
| Front-Surface Antireflection Layer | 18.1% | 33.7% | 2.35 | 1.05 | 0.1% | 0 | 56 | 0.42 |
| Light-Shielding Layer | | | 1.88 | 2.05 | | 15 | 0 | |

Example 9

Figure 6:
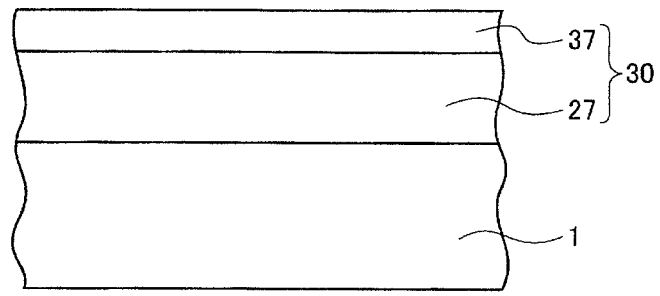
FIG. 6 is a sectional view illustrating the structure of a photomask blank according to Example 9.

FIG. 6 is a sectional view illustrating the structure of a photomask blank according to Example 9. Hereinbelow, referring to FIG. 6, the photomask blank according to Example 9 will be described. The photomask blank according to Example 9 is configured such that a Ta nitride layer (light-shielding layer) 27 having a thickness of 45.7 nm is formed on a glass substrate 1 made of synthetic quartz and a Mo—Si—N layer (front-surface antireflection layer) 37 having a thickness of 10 nm is formed on the Ta nitride layer 27. The N content of the Ta nitride layer 27 is 16 at % and the N content of the Mo—Si—N layer 37 is 57 at %.

The photomask blank according to Example 9 is manufactured in the following manner: As in Example 1, a substrate 1 made of synthetic quartz and having an about 152 mm×152 mm square size with a thickness of 6.35 mm was introduced into a DC magnetron sputtering apparatus. The DC magnetron sputtering apparatus used for forming a light-shielding film in Example 9 has two sputtering chambers and is capable of film formation using two different sputtering targets in vacuum through a transfer robot. After the inside of the first sputtering chamber was evacuated to $2\times10^{-5}$ (Pa) or less, a mixed gas (sputtering gas) of Ar and $N_2$ was introduced into the first sputtering chamber. In this event, the flow rate of Ar and the flow rate of $N_2$ were adjusted to 38.5 sccm and 9 sccm, respectively. Ta was used as the first sputtering target.

After the gas flow rates were stabilized, the power of a DC power supply was set to 1.5 kW, thereby forming a Ta nitride layer 27 having a thickness of 42.4 nm on the substrate 1. Then, the substrate 1 formed with the Ta nitride layer 27 was, while maintained in a vacuum, transferred into the second sputtering chamber by the transfer robot. After the inside of the second sputtering chamber was evacuated to $2\times10^{-5}$ (Pa) or less, a mixed gas (sputtering gas) of Ar and $N_2$ was introduced into the second sputtering chamber. In this event, the flow rate of Ar and the flow rate of $N_2$ were adjusted to 9 sccm and 36 sccm, respectively. A Mo—Si alloy (Mo:Si=10:90 atomic ratio) was used as the second sputtering target. After the gas flow rates were stabilized, the power of a DC power supply was set to 1.8 kW, thereby forming a Mo—Si—N layer 37 having a thickness of 10 nm on the Ta nitride layer 27.

The reflectance (front-surface reflectance) of a surface, remote from the substrate 1, of a light-shielding film 30 thus formed was 10.2% for ArF exposure light. The reflectance (back-surface reflectance) of a surface, where the light-shielding film 30 was not formed, of the substrate 1 was 35.0% for ArF exposure light. Further, the transmittance for ArF exposure light was 0.1%. XPS analysis was performed for an evaluation light-shielding film formed in the same manner, wherein the N content of the Ta nitride layer 27 was 16 at % and the N content of the Mo—Si—N layer 37 was 57 at %. Further, the surface roughness in a 1 μm square area of the evaluation light-shielding film was measured using an AFM and the value of Rms was 0.28 nm. Further, defect inspection was conducted using M1350 (trade name) manufactured by Lasertec Corporation and it was confirmed that it was possible to identify defects normally.

The manufacturing conditions and so on of Example 9 are collectively shown in Table 25.

TABLE 25

Configuration of Example 9

| Material | Thickness (nm) | Introduced Gas during Sputtering | | | |
|---|---|---|---|---|---|
| | | Xe (sccm) | Ar (sccm) | N₂ (sccm) | O₂ (sccm) |
| Front-Surface Antireflection Layer | Mo—Si—N | 10 | 0 | 9 | 36 | 0 |
| Light-Shielding Layer | Ta—N | 45.7 | 0 | 38.5 | 9 | 0 |

Further, the optical properties and so on of the photomask blank according to Example 9 are collectively shown in Table 26.

TABLE 26

Properties of Example 9

| | Optical Properties | | | | Composition | | Surface |
|---|---|---|---|---|---|---|---|
| | Front-Surface Reflectance | Back-Surface Reflectance | n | k | Transmittance | N Content (at %) | O Content (at %) | Roughness Rms (nm) |
| Front-Surface Antireflection Layer | 10.2% | 35.0% | 2.42 | 0.63 | 0.1% | 57 | 0 | 0.28 |
| Light-Shielding Layer | | | 2.00 | 2.22 | | 16 | 0 | |

Herein, if the surface roughness of the light-shielding film 30 is large, pattern edge (side wall) portions thereof after patterning become coarse to adversely affect the accuracy of pattern transfer particularly in the case of a narrow pattern width. It has been found that this surface roughness depends on the N content in the case of a Ta nitride layer. Hereinbelow, there are shown results of forming various Ta nitride layers with different N contents and measuring the surface roughness Rms of those Ta nitride layers. The measurement conditions are as follows:

Thickness of Ta Nitride Layer: 100 nm
Measuring Apparatus: NonoScope III (trade name) manufactured by Digital Instrument Corporation
Measurement Area: 1 μm square
Number of Measurement Data: 256 points×256 points
The measurement results are shown in Table 27.

TABLE 27

| N Content in Ta Nitride Layer (at %) | | | | | |
|---|---|---|---|---|---|
| | 0 | 7 | 16 | 32 | 51 | 62 |
| Rms (nm) | 0.59 | 0.50 | 0.27 | 0.25 | 0.29 | 1.46 |

Figure 7:
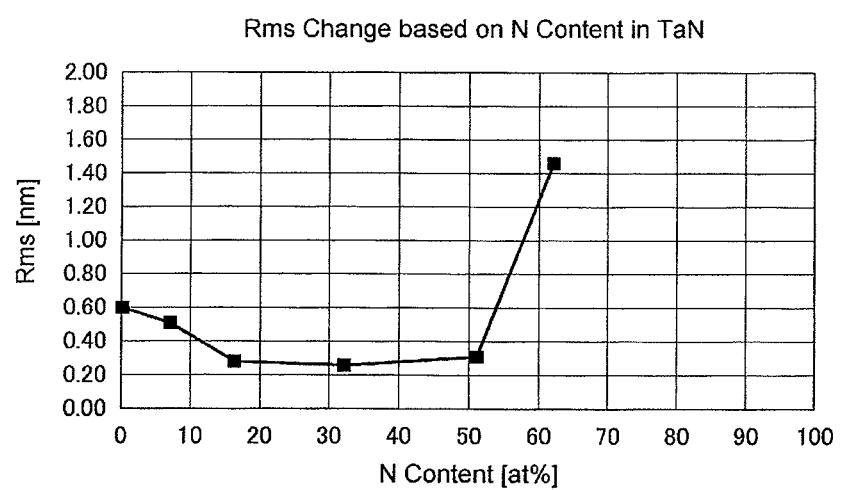
FIG. 7 is a graph showing the results of measuring the relationship between the N content of a Ta nitride layer and the surface roughness thereof.
Figure 8A:
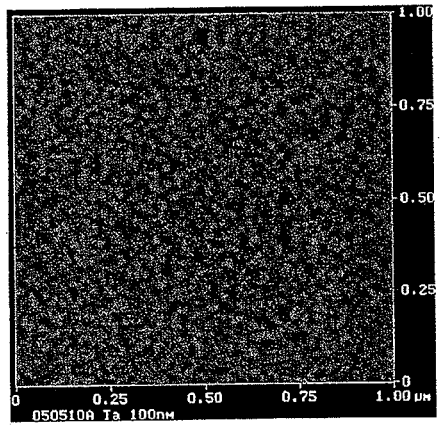
FIGS. 8A to 8D are diagrams showing enlarged photographs of surfaces of Ta nitride layers, wherein the surfaces have surface roughnesses corresponding to the N contents of the Ta nitride layers, respectively.
Figure 8B:
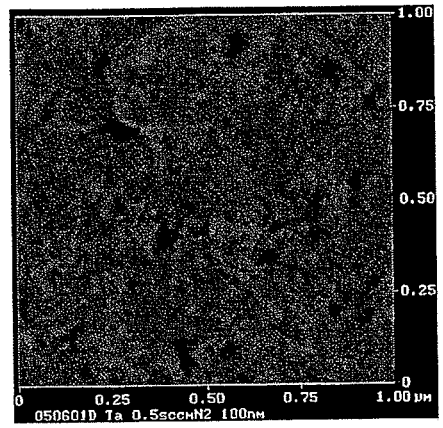
Figure 8C:
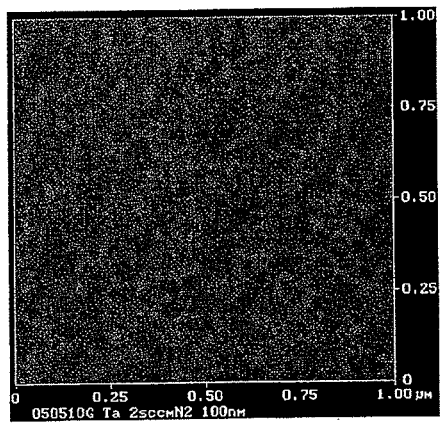
Figure 8D:
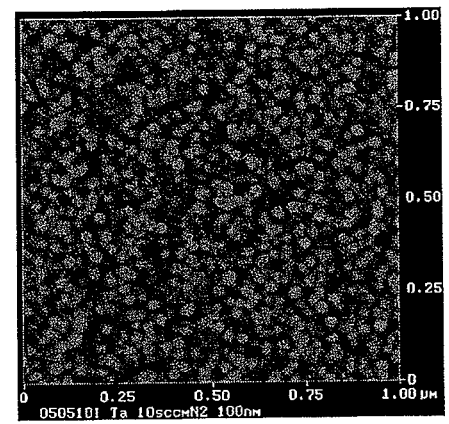
Figure 9:
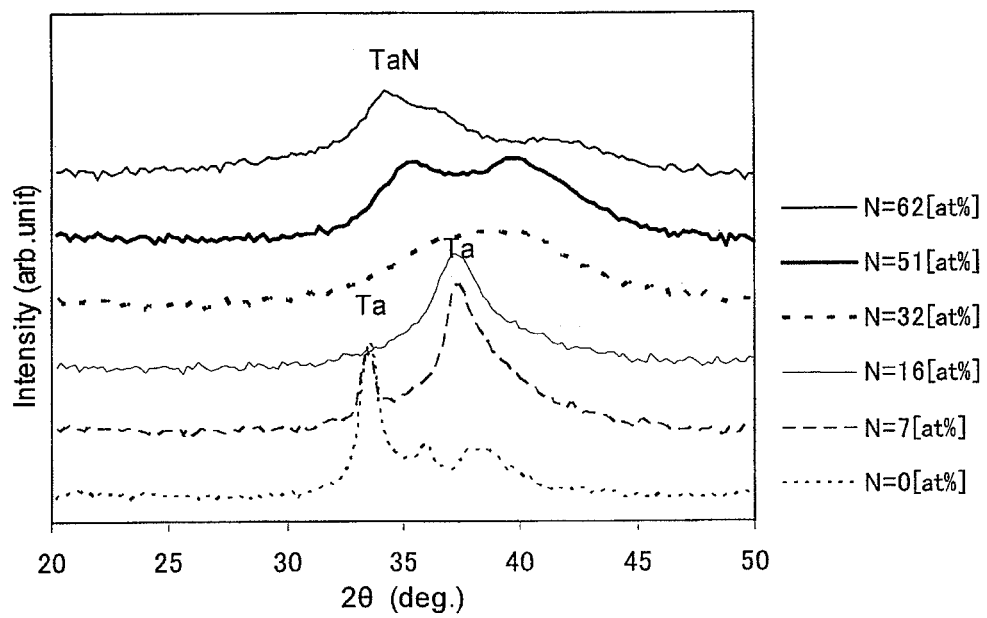
FIG. 9 is a diagram showing spectra obtained by performing XRD (X-ray diffraction) analysis of the respective Ta nitride layers.

FIG. 7 is a graph showing the results of measuring the relationship between the N content of a Ta nitride layer and the surface roughness thereof, FIGS. 8A to 8D are diagrams showing enlarged photographs of surfaces of Ta nitride layers, wherein the surfaces have surface roughnesses corresponding to the N contents of the Ta nitride layers, respectively, and FIG. 9 is a diagram showing spectra obtained by performing XRD (X-ray diffraction) analysis of the respective Ta nitride layers.

Figure 10:
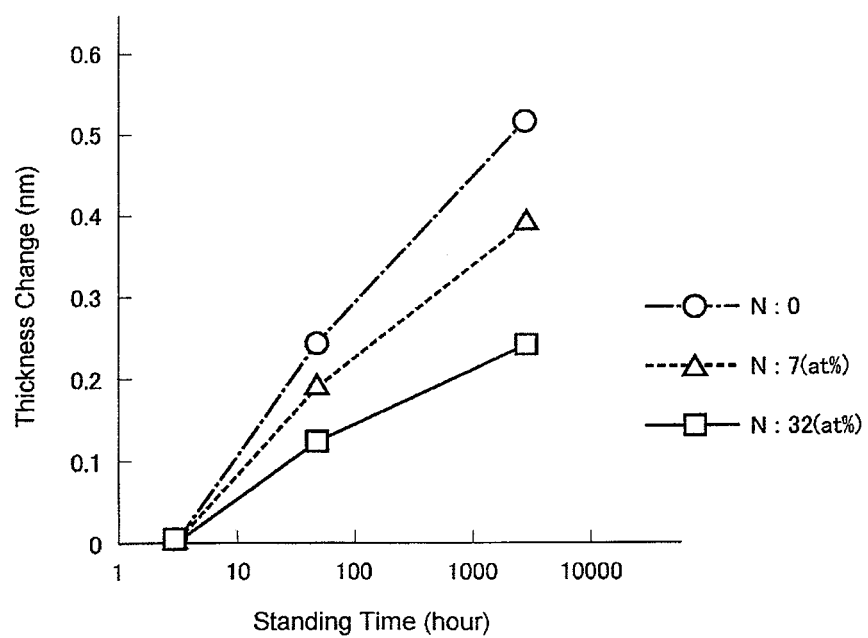
FIG. 10 is a graph showing the results of measuring the relationship between the N content of a Ta nitride layer and the degree of natural oxidation thereof.

Further, it is expected that when a Ta nitride layer is exposed at pattern side walls by etching, the pattern width changes due to natural oxidation. It has been found that, in this case, the degree of the natural oxidation depends on the N content. Hereinbelow, there are shown results of measuring the relationship between the N content of a Ta nitride layer and the degree of natural oxidation thereof. The measurement conditions are as follows:

Measuring Method: X-ray Reflectance Measurement
Measuring Apparatus: GXR-300 (trade name) manufactured by Rigaku Corporation The measurement results are as shown in Table 28. FIG. 10 is a graph showing the results of measuring the relationship between the N content of a Ta nitride layer and the degree of natural oxidation thereof. From the results, it is seen that as the N content increases, the oxidation degree decreases.

TABLE 28

| Standing Time | N: 0 | N: 7 (at %) | N: 32 (at %) |
|---|---|---|---|
| 3 | 0 | 0 | 0 |
| 48 | 0.24 | 0.19 | 0.12 |
| 2880 | 0.52 | 0.39 | 0.24 |

A photomask according to this invention can be used as a mask in, for example, forming a fine pattern by photolithography in the manufacture of semiconductor devices, and a photomask blank according to this invention can be used as a photomask blank serving as an intermediate product that can be formed into a photomask by applying certain treatments thereto.

While the invention made by the present inventor has been described in detail based on the Examples, it is needless to say that this invention is not limited thereto, but various changes may be made within the scope not departing from the gist of the invention.

What is claimed is:

1. A photomask blank comprising:
a transparent substrate;
a light-shielding film formed on the transparent substrate, wherein the light-shielding film comprises:
a light-shielding layer being made of a material containing tantalum nitride and containing 32 at % or less nitrogen; and
a front-surface antireflection layer formed on the light-shielding layer, the front-surface antireflection layer being made of a material containing tantalum oxide and containing 50 at % or more oxygen,
wherein the material of the light-shielding layer has a first refractive index $n_1$ of 2.20 or less and a first extinction coefficient $k_1$ of 2.05 or more, and
the material of the front-surface antireflection layer has a second refractive index $n_2$ of 2.23 or more and a second extinction coefficient $k_2$ of 1.09 or less.

2. The photomask blank according to claim 1, wherein the front-surface antireflection layer contains no nitrogen.

3. The photomask blank according to claim 1, wherein the light-shielding layer contains no oxygen.

4. The photomask blank according to claim 1, wherein the front-surface antireflection layer is formed in contact with the light-shielding layer.

5. The photomask blank according to claim 1, wherein the light-shielding layer is formed in contact with the transparent substrate.

6. The photomask blank according to claim 1, wherein the light-shielding layer is made of a material containing tantalum nitride and containing 7 at % or more nitrogen.

7. The photomask blank according to claim 6, wherein the light-shielding layer is formed in contact with the transparent substrate.

8. The photomask blank according to claim 7, wherein the light-shielding film has a transmittance of 0.2% or less and a back-surface reflectance of less than 40% with respect to a ArF excimer laser exposure light.

9. The photomask blank according to claim 6, wherein the light-shielding layer is made of a material containing tantalum nitride and containing 51 at % or less nitrogen.

10. The photomask blank according to claim 9, wherein the light-shielding film has a surface roughness of 0.26 nmRms or more and 0.49 nmRms or less.

11. The photomask blank according to claim 1,
wherein the material of the light-shielding layer has a first refractive index $n_1$ of 1.80 or more and a first extinction coefficient $k_1$ of more than 2.37 or less, and
the material of the front-surface antireflection layer has a second refractive index $n_2$ of 2.35 or less and a second extinction coefficient $k_2$ of 1.05 or more.

12. The photomask blank according to claim 1, wherein the light-shielding film has a thickness of less than 65 nm.

13. The photomask blank according to claim 1, wherein the front-surface antireflection layer has a thickness of 5 nm or more and 20 nm or less.

14. The photomask blank according to claim 1, wherein at least one of the light-shielding layer and the front-surface antireflection layer is made of a material containing boron.

15. A photomask wherein a transfer pattern is formed in the light-shielding film of the photomask blank according to claim 1.

16. A method of manufacturing a photomask in which a transfer pattern is formed in the light-shielding film of the photomask blank according to claim 1, comprising the step of:
dry-etching the front-surface antireflection layer with a fluorine-based gas containing no oxygen using, as an etching mask, a resist film having the transfer pattern; and
dry-etching the light-shielding layer, with a chlorine-based gas containing no oxygen using, as an etching mask, at least one of the resist film and the front-surface antireflection layer.

17. A photomask blank comprising:
a transparent substrate having a front-surface and a back surface, and
a light-shielding film formed on the transparent substrate, wherein the light-shielding film comprises:
a light-shielding layer formed on the front-surface of the transparent substrate, the light-shielding layer being made of a material containing tantalum nitride and containing less than 32 at % or less nitrogen; and
a front-surface antireflection layer formed on the light-shielding layer, the front-surface antireflection layer being made of a material containing tantalum oxide and containing 50 at % or more oxygen,
wherein the light-shielding film has a multi-layer structure in which an antireflection layer is not formed on the back surface of the transparent substrate,
wherein the material of the light-shielding layer has a first refractive index n1 of 2.20 or less and a first extinction coefficient $k_1$ of 2.05 or more, and
the material of the front-surface antireflection layer has a second refractive index $n_2$ of 2.23 or more and a second extinction coefficient $k_2$ of 1.09 or less.

18. The photomask blank according to claim 17,
wherein the material of the light-shielding layer has a first refractive index $n_1$ of 1.80 or more and a first extinction coefficient $k_1$ of 2.37 or less, and
the material of the front-surface antireflection layer has a second refractive index $n_2$ of 2.35 or less and a second extinction coefficient $k_2$ of 1.05 or more.

* * * * *